US009182219B1

(12) United States Patent
Manassen et al.

(10) Patent No.: US 9,182,219 B1
(45) Date of Patent: Nov. 10, 2015

(54) OVERLAY MEASUREMENT BASED ON MOIRE EFFECT BETWEEN STRUCTURED ILLUMINATION AND OVERLAY TARGET

(71) Applicant: KLA-Tencor Corporation, Milpitas, CA (US)

(72) Inventors: Amnon Manassen, Haifa (IL); Barry Loevsky, Yokneam Illit (IL); Zeev Bomzon, Kiryat Tivon (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/160,279

(22) Filed: Jan. 21, 2014

Related U.S. Application Data

(60) Provisional application No. 61/754,755, filed on Jan. 21, 2013.

(51) Int. Cl.
*G01B 11/14* (2006.01)
*H01L 23/544* (2006.01)
*G03F 7/20* (2006.01)

(52) U.S. Cl.
CPC ............ *G01B 11/14* (2013.01); *G03F 7/70633* (2013.01); *H01L 23/544* (2013.01)

(58) Field of Classification Search
None
See application file for complete search history.

(56) References Cited

U.S. PATENT DOCUMENTS

| | | | |
|---|---|---|---|
| 4,643,579 A | 2/1987 | Toriumi et al. | |
| 4,929,083 A * | 5/1990 | Brunner | 356/400 |
| 4,973,136 A | 11/1990 | Braatz | |
| 5,086,477 A | 2/1992 | Yu et al. | |
| 5,151,750 A | 9/1992 | Magome et al. | |
| 5,216,257 A * | 6/1993 | Brueck et al. | 250/548 |
| 5,583,609 A | 12/1996 | Mizutani et al. | |
| 5,602,492 A | 2/1997 | Cresswell et al. | |
| 5,712,707 A | 1/1998 | Ausschnitt et al. | |
| 5,723,236 A | 3/1998 | Inoue et al. | |
| 5,731,877 A | 3/1998 | Ausschnitt | |
| 5,753,416 A | 5/1998 | Okamoto et al. | |
| 5,757,507 A * | 5/1998 | Ausschnitt et al. | 356/401 |
| 5,805,290 A * | 9/1998 | Ausschnitt et al. | 356/401 |
| 5,965,307 A | 10/1999 | Miyatake | |
| 6,150,231 A * | 11/2000 | Muller et al. | 438/401 |
| 6,301,798 B1 | 10/2001 | Liu et al. | |
| 6,538,740 B1 | 3/2003 | Shiraishi et al. | |
| 6,660,462 B1 | 12/2003 | Fukuda | |

(Continued)

FOREIGN PATENT DOCUMENTS

| | | | |
|---|---|---|---|
| KR | 2003053224 A | 6/2003 | |
| KR | 2006019761 A | 3/2006 | |
| WO | 2013132064 A2 | 9/2013 | |

*Primary Examiner* — Gordon J Stock, Jr.
(74) *Attorney, Agent, or Firm* — Suiter Swantz pc llo

(57) ABSTRACT

A method and system for overly measurement is disclosed. The overlay measurement is performed based on moiré effect observed between structured illumination grids and overlay targets. A structured illumination is used to illuminate a first overlay target and a second overlay target. Upon obtaining an image of the first overlay target illuminated by the structured illumination and an image of the second overlay target illuminated by the structured illumination, relative displacement between the first overlay target and the structured illumination and relative displacement between the second overlay target and the structured illumination are measured. The overlay between the first overlay target and the second overlay target is then measured based on their relative displacements with respect to the structured illumination.

20 Claims, 6 Drawing Sheets

(56) References Cited

U.S. PATENT DOCUMENTS

| | | |
|---|---|---|
| 6,730,444 B2 | 5/2004 | Bowes |
| 6,742,168 B1 | 5/2004 | Nariman |
| 6,788,393 B2 | 9/2004 | Inoue |
| 6,812,045 B1 | 11/2004 | Nikoonahad et al. |
| 6,836,560 B2 | 12/2004 | Emery |
| 6,887,625 B2 | 5/2005 | Baselmans et al. |
| 6,898,306 B1 | 5/2005 | Lu |
| 7,058,221 B1 | 6/2006 | Shikata |
| 7,180,593 B2 | 2/2007 | Lin |
| 7,242,477 B2 * | 7/2007 | Mieher et al. .................. 356/401 |
| 7,288,344 B2 | 10/2007 | Frost et al. |
| 7,440,105 B2 | 10/2008 | Adel et al. |
| 7,465,591 B2 | 12/2008 | Borden et al. |
| 7,528,941 B2 | 5/2009 | Kandel et al. |
| 7,557,921 B1 * | 7/2009 | Adel et al. ..................... 356/401 |
| 7,626,702 B2 | 12/2009 | Ausschnitt et al. |
| 7,629,697 B2 | 12/2009 | Van Haren et al. |
| 7,751,046 B2 | 7/2010 | Levy et al. |
| 7,847,939 B2 | 12/2010 | Smith et al. |
| 7,873,504 B1 | 1/2011 | Bevis |
| 7,879,627 B2 | 2/2011 | Ghinovker et al. |
| 8,441,639 B2 | 5/2013 | Kandel et al. |
| 8,681,413 B2 * | 3/2014 | Manassen et al. ............ 359/291 |
| 2001/0007498 A1 | 7/2001 | Arai et al. |
| 2002/0041377 A1 | 4/2002 | Hagiwara et al. |
| 2002/0158193 A1 | 10/2002 | Sezginer et al. |
| 2003/0021465 A1 | 1/2003 | Adel et al. |
| 2003/0223630 A1 | 12/2003 | Adel et al. |
| 2003/0224261 A1 | 12/2003 | Schulz |
| 2004/0004726 A1 | 1/2004 | Sezginer et al. |
| 2004/0040003 A1 | 2/2004 | Seligson et al. |
| 2004/0184652 A1 | 9/2004 | Tsuchiya et al. |
| 2004/0233439 A1 | 11/2004 | Mieher et al. |
| 2005/0105092 A1 | 5/2005 | Ausschnitt et al. |
| 2005/0140986 A1 * | 6/2005 | Butler ........................... 356/509 |
| 2005/0173634 A1 | 8/2005 | Wong et al. |
| 2005/0195398 A1 | 9/2005 | Adel et al. |
| 2005/0272221 A1 | 12/2005 | Yen et al. |
| 2006/0051682 A1 | 3/2006 | Hess et al. |
| 2006/0210893 A1 | 9/2006 | Van Bilsen |
| 2006/0269848 A1 | 11/2006 | Setta |
| 2007/0058169 A1 | 3/2007 | Ausschnitt et al. |
| 2007/0069398 A1 | 3/2007 | Smith et al. |
| 2007/0096094 A1 | 5/2007 | Levinski et al. |
| 2007/0158580 A1 | 7/2007 | Ward et al. |
| 2007/0158581 A1 | 7/2007 | Ward et al. |
| 2007/0158582 A1 | 7/2007 | Ward et al. |
| 2007/0230770 A1 | 10/2007 | Kulkarni et al. |
| 2007/0279630 A1 * | 12/2007 | Kandel et al. ................. 356/401 |
| 2008/0094639 A1 | 4/2008 | Widmann et al. |
| 2008/0112609 A1 | 5/2008 | Inoue |
| 2008/0279442 A1 | 11/2008 | Den Boef et al. |
| 2008/0279444 A1 | 11/2008 | Fischer et al. |
| 2009/0001615 A1 | 1/2009 | Li et al. |
| 2009/0136117 A1 | 5/2009 | Barkol et al. |
| 2009/0187383 A1 | 7/2009 | Li et al. |
| 2009/0195768 A1 | 8/2009 | Bijnen et al. |
| 2009/0220872 A1 | 9/2009 | Oishi |
| 2009/0243095 A1 | 10/2009 | Fujita et al. |
| 2010/0052191 A1 | 3/2010 | Trogisch et al. |
| 2011/0069314 A1 | 3/2011 | Ausschnitt et al. |
| 2011/0076789 A1 | 3/2011 | Kuroda |
| 2011/0155904 A1 | 6/2011 | Hotta et al. |
| 2011/0249247 A1 | 10/2011 | Cramer et al. |
| 2012/0146159 A1 | 6/2012 | Wang et al. |
| 2012/0206729 A1 * | 8/2012 | Seligson et al. ............... 356/445 |
| 2012/0243004 A1 | 9/2012 | El Gawhary et al. |
| 2013/0083306 A1 | 4/2013 | Smirnov et al. |
| 2013/0271740 A1 | 10/2013 | Quintanilha |
| 2013/0304424 A1 | 11/2013 | Bakeman et al. |
| 2014/0065832 A1 | 3/2014 | Hsieh et al. |

* cited by examiner

OVERLAY MEASUREMENT BASED ON MOIRE EFFECT BETWEEN STRUCTURED ILLUMINATION AND OVERLAY TARGET

CROSS-REFERENCE TO RELATED APPLICATIONS

The present application claims the benefit under 35 U.S.C. §119(e) of U.S. Provisional Application Ser. No. 61/754,755, filed Jan. 21, 2013. Said U.S. Provisional Application Ser. No. 61/754,755 is hereby incorporated by reference in its entirety.

TECHNICAL FIELD

The disclosure generally relates to the field of semiconductor fabrication, particularly to configurations of metrology targets used for semiconductor device fabrication.

BACKGROUND

Thin polished plates such as silicon wafers and the like are a very important part of modern technology. A wafer, for instance, refers to a thin slice of semiconductor material used in the fabrication of integrated circuits and other devices. Other examples of thin polished plates may include magnetic disc substrates, gauge blocks and the like. Modern semiconductor devices are typically fabricated from layers of wafers. Precise positioning and alignment during semiconductor fabrication is of critical importance.

SUMMARY

The present disclosure is directed to an overly measurement method. The method includes: providing a structured illumination, the structured illumination defining an illumination grid according to an illumination pitch distance; illuminating a first overlay target located on a first process layer utilizing the structured illumination, wherein the first overlay target includes a plurality of line features spaced equally apart from each other according to a target pitch distance different from the illumination pitch distance; illuminating a second overlay target located on a second process layer utilizing the structured illumination, wherein the second overlay target includes a plurality of line features spaced equally apart from each other according to the target pitch distance; obtaining an image of the first overlay target illuminated by the structured illumination and an image of the second overlay target illuminated by the structured illumination; measuring a first relative displacement between the first overlay target and the structured illumination; measuring a second relative displacement between the second overlay target and the structured illumination; and measuring the overlay between the first overlay target and the second overlay target based on their relative displacements with respect to the structured illumination.

A further embodiment of the present disclosure is directed to a metrology system. The metrology system includes a structured illumination device, an imaging device and a processor. The structured illumination device is configured for: defining an illumination grid according to an illumination pitch distance; illuminating a first overlay target located on a first process layer utilizing the illumination grid, wherein the first overlay target includes a plurality of line features spaced equally apart from each other according to a target pitch distance different from the illumination pitch distance; and illuminating a second overlay target located on a second process layer utilizing the illumination grid, wherein the second overlay target includes a plurality of line features spaced equally apart from each other according to the target pitch distance. The imaging device is configured for obtaining an image of the first overlay target illuminated by the illumination grid and an image of the second overlay target illuminated by the illumination grid. The processor is configured for: measuring a first relative displacement between the first overlay target and the illumination grid; measuring a second relative displacement between the second overlay target and the illumination grid; and measuring the overlay between the first overlay target and the second overlay target based on their relative displacements with respect to the illumination grid.

Furthermore, the present disclosure is directed to a semiconductor device. The semiconductor device includes an overlay measurement target. The overlay measurement target includes a plurality of line features spaced equally apart from each other according to a target pitch distance, wherein the plurality of line features are configured to be detectable by a metrology system but not fully resolvable by the metrology system.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Lithographic metrology and in particular, overlay measurements, employ overlay measurement targets to facilitate precise positioning and alignment of various layers during semiconductor fabrication processes. Overlay target marks or patterns are typically printed on the different layers and are resolved in microscopes using visible light. Misalignment between such marks or patterns may be detected and measured.

It is noted that since overlay targets consume real estate available on each layer, it is therefore desirable to reduce the size of such targets. More specifically, small targets that are less than a few micrometers may be desirable. However, reduced target size may also result in reduced measurement accuracy. Therein lies a need for small overlay targets with strong definition of center locations for accurate measurement results.

Figure 1:
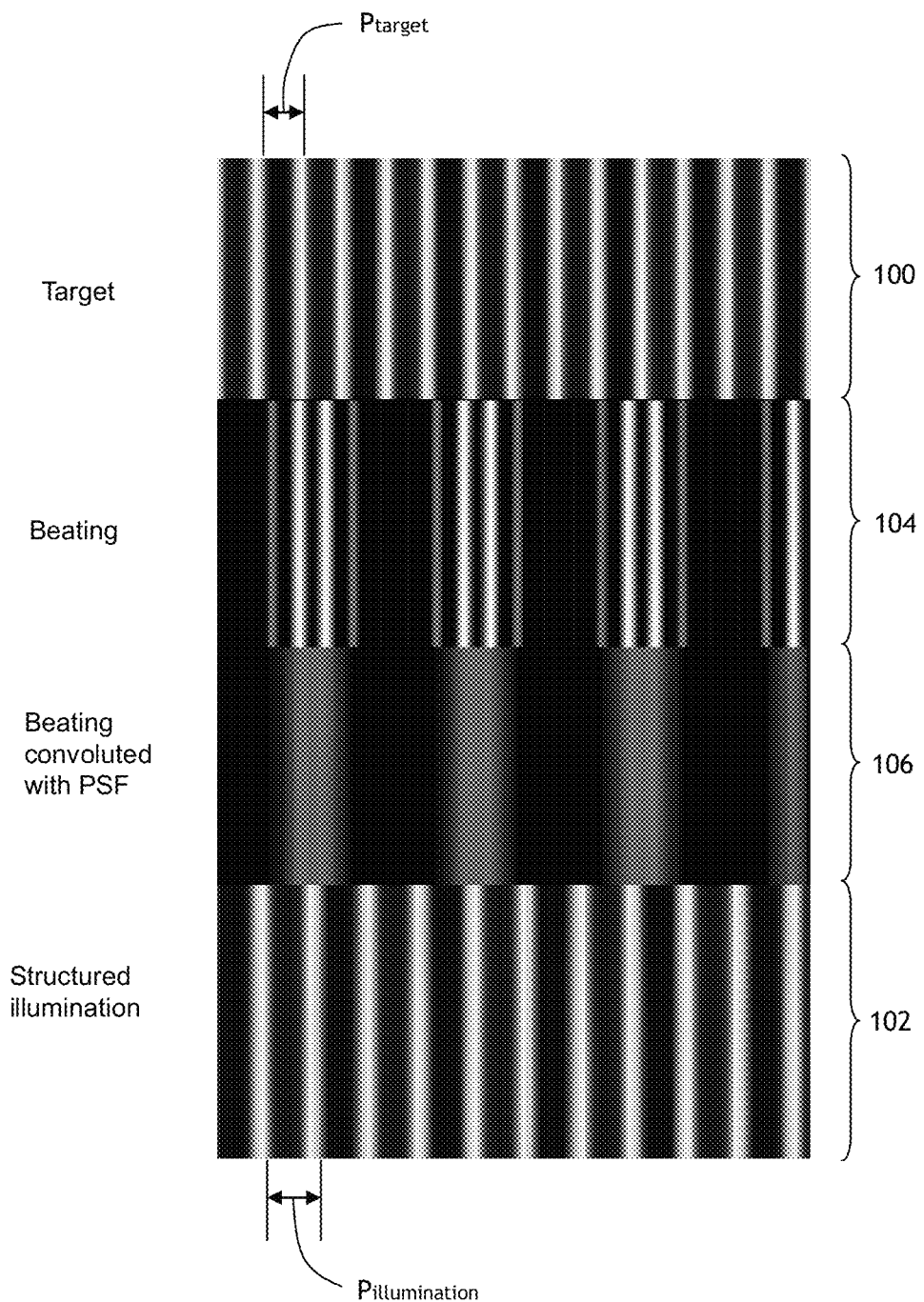
FIG. 1 is an illustration depicting an overlay target, a structured illumination grid, beating and signal obtained by a metrology system.

The present disclosure is directed to a system and method for overlay measurement based on moiré effect observed between structured illumination grids and overlay targets. Referring to FIG. 1, a target 100 in accordance with one embodiment of the present disclosure is shown. The target 100 is constructed from a barely resolved grid per layer. A barely resolved grid may include features (e.g., shown as vertical lines in this example) that are grouped closely together, wherein the features can be detected individually, but are too small to be fully resolved optically by the microscope(s). Therefore, the image(s) of the target 100 obtained by the microscope(s) may show the individual features (e.g., the vertical lines in this example), but they appear to be slightly out of focus because they are not fully resolved.

It is contemplated that providing ability to measure barely resolved grids rather than fully resolved grids allows the target size to be reduced. Such a target size reduction is desirable for better resemblance to device level overlay as well as saving area on the processed dye. Such a target is also useful for multilayer overlay measurement.

In accordance with the present disclosure, the target 100 is illuminated by a barely resolved light pattern, referred to as an illumination grid 102, having a slightly different pitch with respect to the pitch of the target 100. For example, suppose the pitch of the target 100, $P_{target}$, is approximately 200 nm, the pitch of the illumination grid, $P_{illumination}$, may be limited by approximately 250 nm. Such a configuration is expected to result in reflected spectrum with contrast modulation having a period which is the difference between the target and illumination pitches (moiré).

FIG. 1 further illustrates this moiré effect. As mentioned above, target 100 depicts an exemplary target in accordance with one embodiment of the present disclosure. The illumination grid 102 depicts a structured illumination having a slightly different pitch with respect to the pitch of the target 100. When the target 100 is illuminated by the illumination grid 102, the difference between the target and illumination pitches causes beating 104 to occur. Microscope(s) or camera(s) may therefore be utilized to obtain image(s) of the target 100 illuminated by the illumination grid 102. It is noted that the actual signal obtained by the microscope or the camera may be different from beating 104 due to various factors such as the smear effect of any programmable spatial filters used in the metrology system. This smeared/convoluted signal is depicted as signal 106 in FIG. 1 for illustrative purposes.

Since the moiré effect is very sensitive to phase shift with constant phase of illumination, the difference between the target and illumination pitches will shift according to the relative displacement of the target and illumination grids. Based on this observation, it is contemplated that the same illumination grid can be utilized for illuminating targets located on two or more process layers. In this manner, the illumination grid will serve as an anchor (i.e., a reference) and the relative displacement of the difference signals generated for targets located on different process layers can be utilized to indicate the overlay signal. That is, in accordance with the present disclosure, the overlay signal is not measured based on any particular location (e.g., a center location) identified by the target, but instead, the overlay signal is measured based on the relative displacement of different targets against the same structured illumination grid.

Relating back to the grids being barely resolved by the optical system as mentioned above, in an exemplary embodiment, the resolution of the optical system can be defined by the collection numerical aperture (NA) and the illumination wavelength λ, and the resolution criteria (Abbe limit) can be expressed as ~λ/(2*NA). Suppose NA=0.7 and λ>400 nm in this exemplary system, the illumination pitch should be >275 nm and the target pitch should be 5-30% smaller, depended on the target size. It is contemplated that the pitch may change based on different NA and/or λ without departing from the spirit and scope of the present disclosure.

Figure 2:
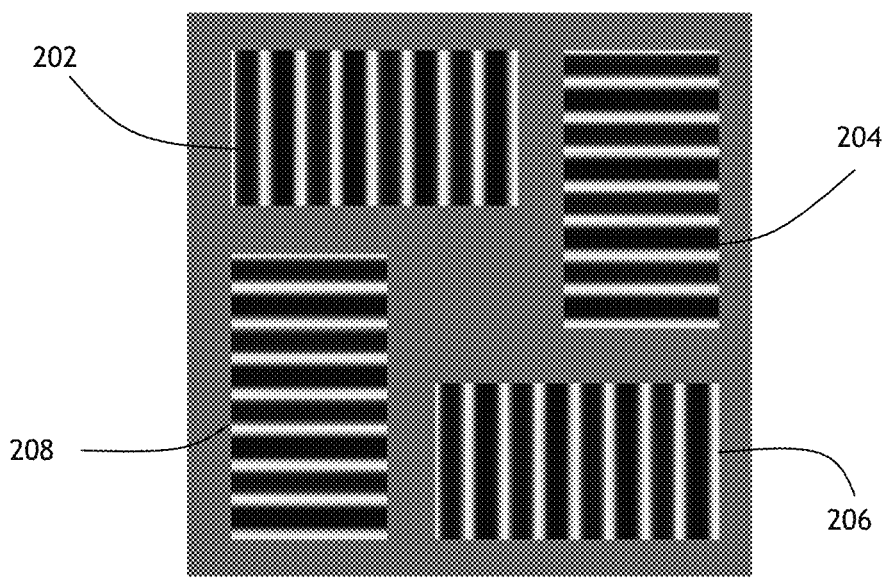
FIG. 2 is an illustration depicting overlay targets in accordance with certain embodiments of the present disclosure.
Figure 3:
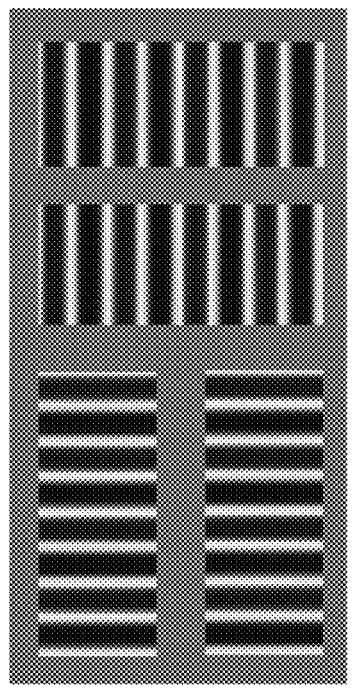
FIG. 3 is an illustration depicting overlay targets in accordance with certain embodiments of the present disclosure arranged in a different manner.

FIGS. 2 and 3 are illustrations depicting some exemplary target configurations that may be utilized for different process layers. It is noted that because the phase change is measured relative to the structured illumination pattern, one of the advantages of the moiré-based target in accordance with the present disclosure is that only one strip oriented in one direction (e.g., x- or y-axis along the process layer) is needed for a given process layer. That is, the four target strips 202, 204, 206 and 208 may be located on four different process layers. It is contemplated, however, that a process layer may include more than one target strip without departing from the spirit and scope of the present disclosure.

It is also contemplated that a rectangular target design as depicted in FIG. 3 may also be made possible using the moiré-based target in accordance with the present disclosure. Depending on the specific layout of certain process layers, placing rectangular targets may be more convenient. It is also understood that target strips forming various other shapes and sizes may also be utilized without departing from the spirit and scope of the present disclosure.

Figure 4:
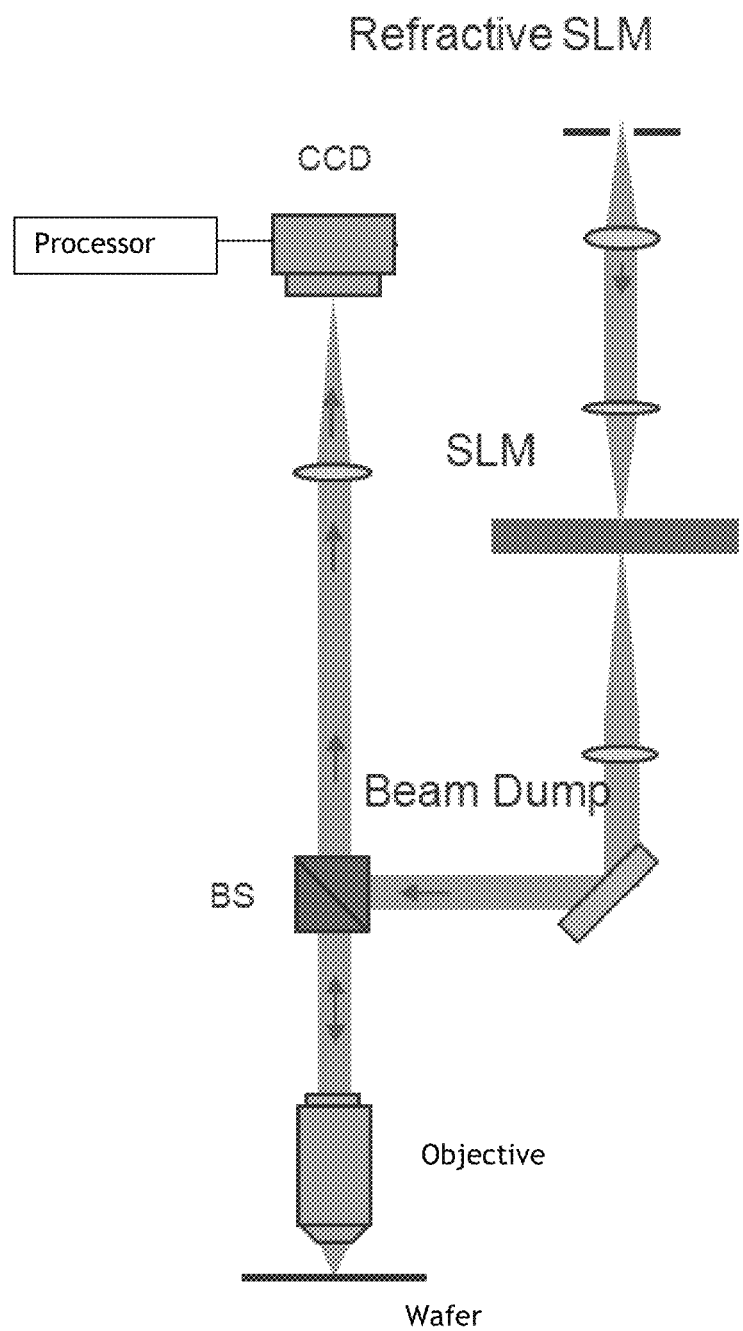
FIG. 4 is a block diagram depicting an exemplary metrology system.
Figure 5:
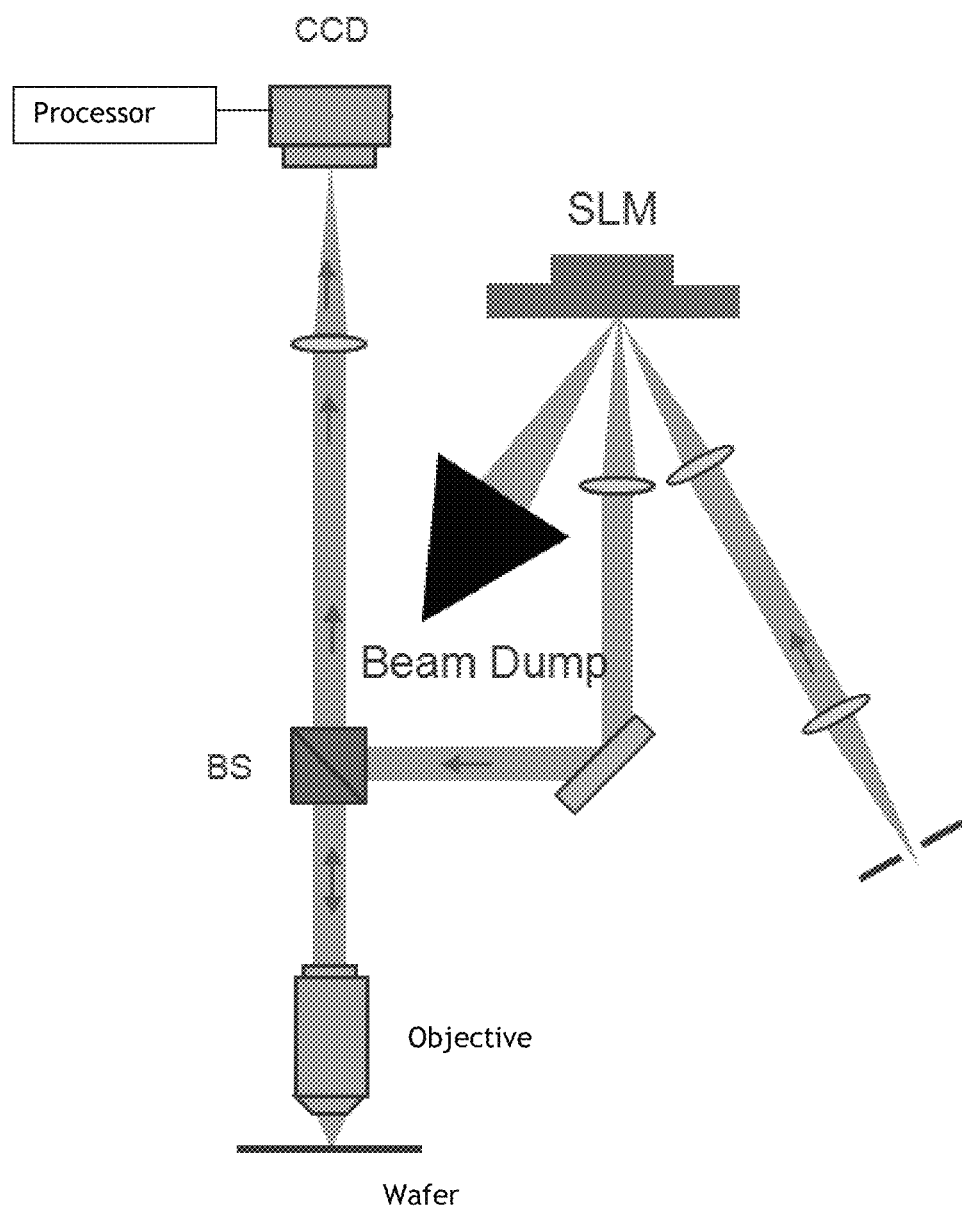
FIG. 5 is a block diagram depicting another exemplary metrology system.
Figure 6:
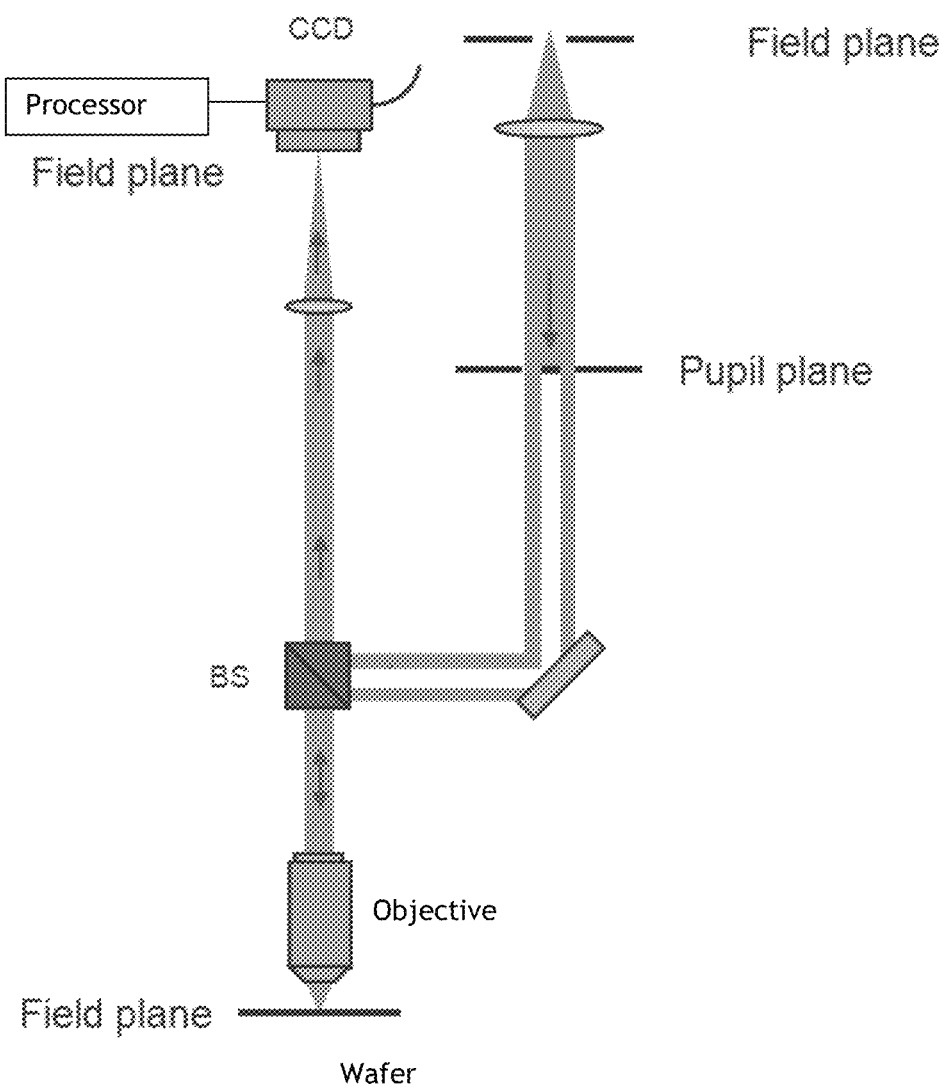
FIG. 6 is a block diagram depicting still another exemplary metrology system.

Referring now to FIGS. 4 through 6, block diagrams depicting exemplary metrology systems are is shown. The metrology systems may utilize illumination devices capable of achieving a programmed illumination grid (or any other shape) in the field of an imaging microscope using a micro array device to provide spatial light distribution on the wafer plane. In one embodiment, as illustrated in FIG. 4, spatial light modulation is provided on the field plane using one or more refractive Spatial Light Modulator (SLM). The SLM may be implemented using a Digital Micromirror Device (DMD) or Liquid Crystal (LC) type or other refractive spatial light modulators. The SLM may be utilized to generate any required field illumination (e.g., a programmable illumination grid). An imaging device (e.g., CCD) may be utilized to obtain the images of the wafer and the illumination grids generated by the micromirror array, and the images obtained may then be provided to a processor to carry out the overlay measurement process in accordance with the present disclosure as described above. It is contemplated that the processor may be implemented utilizing any standalone or embedded computing device (e.g., a computer, a processing unit/circuitry or the like). It is further contemplated that other techniques may be utilized to provide structured light sources for illuminating targets without departing from the spirit and scope of the present disclosure.

It is also contemplated that reflective SLMs may also be utilized to provide spatial light modulation on the field plane, as illustrated in FIG. 5. It is contemplated that nonconherent light sources may be utilized and high NA illumination can be provided in metrology systems utilizing either reflective SLM or refractive SLM as described above.

Furthermore, it is contemplated that various other types of illumination systems may be utilized to provide the illumination grids without departing from the spirit and scope of the present disclosure. For instance, as illustrated in FIG. 6, a two-point illumination on pupil plane (e.g., double pinhole stop placed in the pupil plane) may also be utilized to provide the illumination grid in accordance with the present disclosure. Utilizing a coherent light source and a Low NA illumination, a periodic interference pattern should appear on the field plane to provide the illumination grid.

Figure 7:
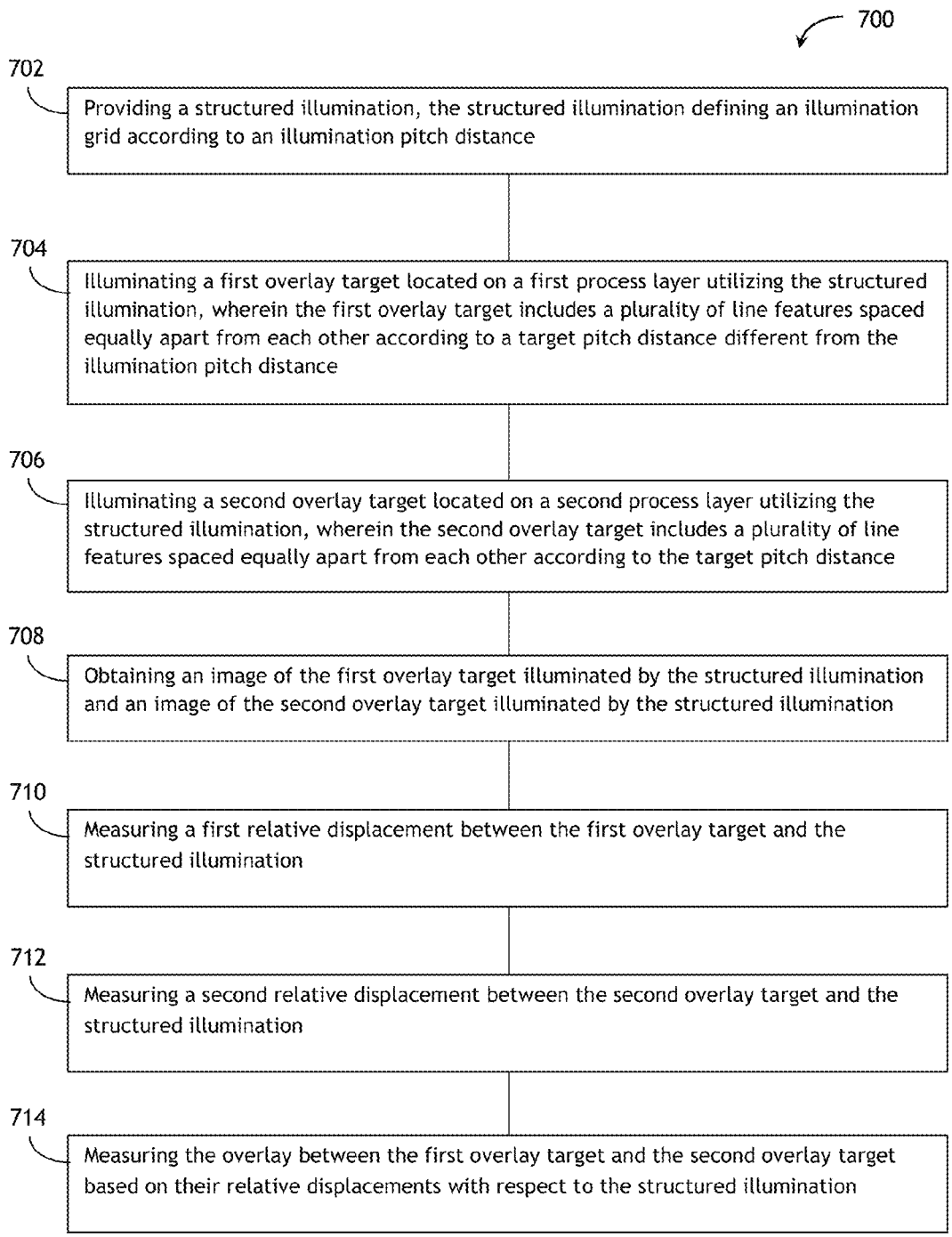
FIG. 7 is a flow diagram illustrating a method for measuring overlay based on moiré effect between structured illumination and overlay target.

FIG. 7 illustrates a method 7500 for measuring overlay based on moiré effect between structured illumination and overlay target. Step 702 provides a structured illumination. As described above, the structured illumination defines an illumination grid according to an illumination pitch distance. The structured illumination is utilized to illuminate the overlay targets located on various process layers. For instance, a first overlay target located on a first process layer may be illuminated in step 704, and a second overlay target located on a second process layer may be illuminated in step 706 (steps 704 and 706 may be carried out simultaneously). As described above, each of the first and second overlay targets includes a plurality of line features spaced equally apart from each other according to a target pitch distance, which is different from the illumination pitch distance. It is noted that since the zero phase is defined by the illumination, the phase change is linear with respect to (overlay/pitch). For example, if the illumination pitch is 300 nm, target pitch is 250 nm, the moiré pitch will be 1500 nm. OVL of 5 nm will show phase shift of 0.02RAD which is 30 nm in moiré pattern.

Subsequently, an image of the first overlay target illuminated by the structured illumination and an image of the second overlay target illuminated by the structured illumination may be obtained in step 708. Based on the images obtained, step 710 may measure a first relative displacement between the first overlay target and the structured illumination and step 712 may measure a second relative displacement between the second overlay target and the structured illumination. For instance, if the image (moiré effect) of the first overlay target illuminated by the structured illumination and the image (moiré effect) of the second overlay target illuminated by the structured illumination appear to be different, this different may indicate misalignment between the two process layers. Therefore, the overlay error between the first overlay target and the second overlay target may then be measured in step 714 based on their relative displacements with respect to the structured illumination. It is contemplated that overlay of additional process layers may be processed in the same manner.

It is also contemplated that certain optical aberrations may occur during the measurement process. However, since the illumination pattern is known, any optical aberrations can be measured and algorithmically corrected, and the optical aberrations can therefore be compensated to improve the accuracy of the overlay measurement.

The methods disclosed may be implemented as sets of instructions, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. An overlay measurement method, comprising:
   providing a structured illumination, the structured illumination defining an illumination grid according to an illumination pitch distance;
   illuminating a first overlay target located on a first process layer utilizing the structured illumination, wherein the first overlay target includes a plurality of line features spaced equally apart from each other according to a target pitch distance different from the illumination pitch distance;
   illuminating a second overlay target located on a second process layer utilizing the structured illumination, wherein the second overlay target includes a plurality of line features spaced equally apart from each other according to the target pitch distance;
   obtaining an image of the first overlay target illuminated by the structured illumination and an image of the second overlay target illuminated by the structured illumination;
   measuring a first relative displacement between the first overlay target and the structured illumination;
   measuring a second relative displacement between the second overlay target and the structured illumination; and
   measuring an overlay between the first overlay target and the second overlay target based on their relative displacements with respect to the structured illumination.

2. The method of claim 1, wherein the first overlay target and the second overlay target are illuminated simultaneously.

3. The method of claim 1, wherein the image of the first overlay target illuminated by the structured illumination and the image of the second overlay target illuminated by the structured illumination are obtained simultaneously.

4. The method of claim 1, wherein the structured illumination is provided utilizing a programmable illumination device.

5. The method of claim 4, wherein the programmable illumination device is implemented utilizing a digital micromirror device.

6. The method of claim 1, wherein the first overlay target, the second overlay target, and the illumination grid are detected without being fully resolved.

7. The method of claim 1, wherein the difference between the target pitch distance and the illumination pitch distance is within 5-30%.

8. A metrology system, comprising:
   a structured illuminator, the structured illuminator configured for:
      defining an illumination grid according to an illumination pitch distance;
      illuminating a first overlay target located on a first process layer utilizing the illumination grid, wherein the first overlay target includes a plurality of line features spaced equally apart from each other according to a target pitch distance different from the illumination pitch distance; and
      illuminating a second overlay target located on a second process layer utilizing the illumination grid, wherein the second overlay target includes a plurality of line features spaced equally apart from each other according to the target pitch distance;
   an imager, the imager configured for obtaining an image of the first overlay target illuminated by the illumination grid and an image of the second overlay target illuminated by the illumination grid; and a processor, the processor configured for:
measuring a first relative displacement between the first overlay target and the illumination grid;
measuring a second relative displacement between the second overlay target and the illumination grid; and
measuring an overlay between the first overlay target and the second overlay target based on their relative displacements with respect to the illumination grid.

9. The metrology system of claim 8, wherein the first overlay target and the second overlay target are illuminated simultaneously.

10. The metrology system of claim 8, wherein the image of the first overlay target illuminated by the illumination grid and the image of the second overlay target illuminated by the illumination grid are obtained simultaneously.

11. The metrology system of claim 8, wherein the structured illuminator is a programmable illuminator.

12. The metrology system of claim 11, wherein the programmable illuminator includes a digital micromirror.

13. The metrology system of claim 8, wherein the first overlay target, the second overlay target, and the illumination grid are detected without being fully resolved.

14. The metrology system of claim 8, wherein the difference between the target pitch distance and the illumination pitch distance is within 5-30%.

15. The metrology system of claim 8, wherein the target pitch distance is approximately 200 nm and the illumination pitch distance is approximately 250 nm.

16. A semiconductor device, the semiconductor device including an overlay measurement target, the overlay measurement target comprising:
a plurality of line features spaced equally apart from each other according to a target pitch distance;
wherein the plurality of line features is configured to be detectable individually by an imager of a metrology system but not fully resolvable by the imager of the metrology system, and
wherein the target pitch distance of the plurality of line features is configured to be different from an illumination pitch distance of an illumination grid utilized by the metrology system to illuminate the overlay measurement target.

17. The semiconductor device of claim 16, wherein a moiré pattern is optically observable by the metrology system when the plurality of line features is illuminated by the illumination grid.

18. The semiconductor device of claim 16, wherein the difference between the target pitch distance and the illumination pitch distance is within 5-30%.

19. The semiconductor device of claim 16, wherein the target pitch distance is approximately 200 nm.

20. The semiconductor device of claim 16, wherein the semiconductor device includes a plurality of process layers, and wherein the overlay measurement target is located on at least two of the plurality of process layers.

* * * * *